(12) United States Patent
Yamaguchi et al.

(10) Patent No.: US 9,905,442 B2
(45) Date of Patent: Feb. 27, 2018

(54) HEAT TREATMENT APPARATUS, HEAT TREATMENT METHOD, AND PROGRAM

(71) Applicant: Tokyo Electron Limited, Tokyo (JP)

(72) Inventors: Tatsuya Yamaguchi, Sapporo (JP); Koji Yoshii, Iwate (JP); Masafumi Shoji, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 148 days.

(21) Appl. No.: 15/082,342

(22) Filed: Mar. 28, 2016

(65) Prior Publication Data

US 2016/0293457 A1 Oct. 6, 2016

(30) Foreign Application Priority Data

Mar. 31, 2015 (JP) ................ 2015-074088

(51) Int. Cl.
 *F27B 5/14* (2006.01)
 *H01L 21/67* (2006.01)
 *H01L 21/324* (2006.01)

(52) U.S. Cl.
 CPC ...... *H01L 21/67109* (2013.01); *H01L 21/324* (2013.01); *H01L 21/67248* (2013.01)

(58) Field of Classification Search
 CPC ......... H01L 21/67106; H01L 21/67115; H01L 21/67173; H01L 21/67178; H01L 21/67196; H01L 21/6719; H01L 21/67248; H01L 21/67265; H01L 21/67276; H01L 21/67288; H01L 21/67303; H01L 21/6732; H01L 21/67; H01L 21/324
 See application file for complete search history.

(56) References Cited

FOREIGN PATENT DOCUMENTS

JP 2002-334844 A 11/2002

*Primary Examiner* — Shawntina Fuqua
(74) *Attorney, Agent, or Firm* — Abelman, Frayne & Schwab

(57) ABSTRACT

Disclosed is a heat treatment apparatus including: a heating unit that heats an inside of a processing chamber that accommodates a plurality of workpieces; a temperature drop rate model storing unit that stores a temperature drop rate model; and a heat treatment performing unit that sets the temperature drop rate model stored in the temperature drop model storing unit and sets the inside of the processing chamber to the temperature and the time represented in the temperature drop rate model. The temperature drop rate model storing unit stores a plurality of temperature drop rate models, each of which has a different temperature drop rate. The processing chamber is divided into a plurality of zones, and the temperature drop rate mode is set for each of the zones. The heat treatment performing unit sets different temperature drop rate models in a plurality of zones to heat the plurality of workpieces.

5 Claims, 5 Drawing Sheets

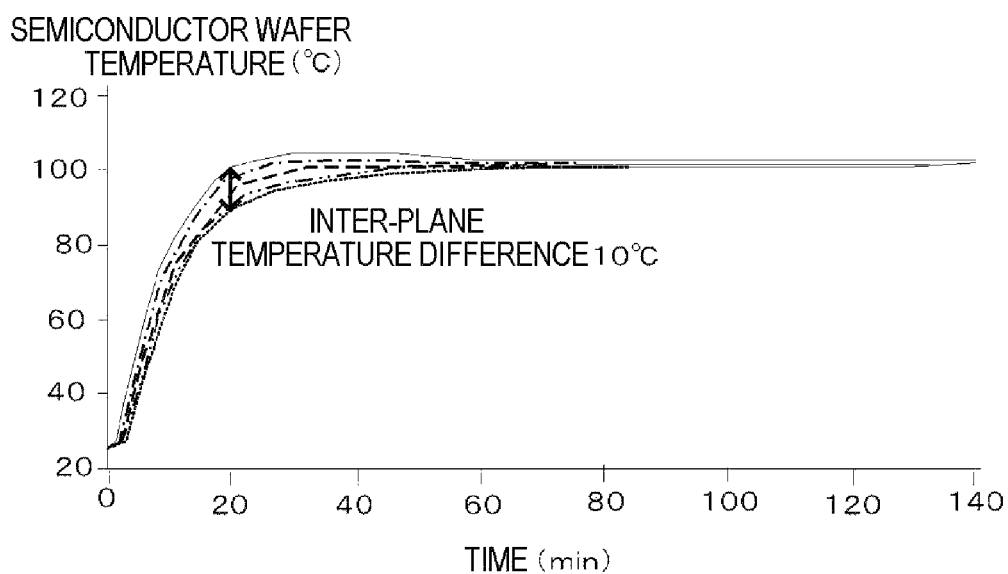
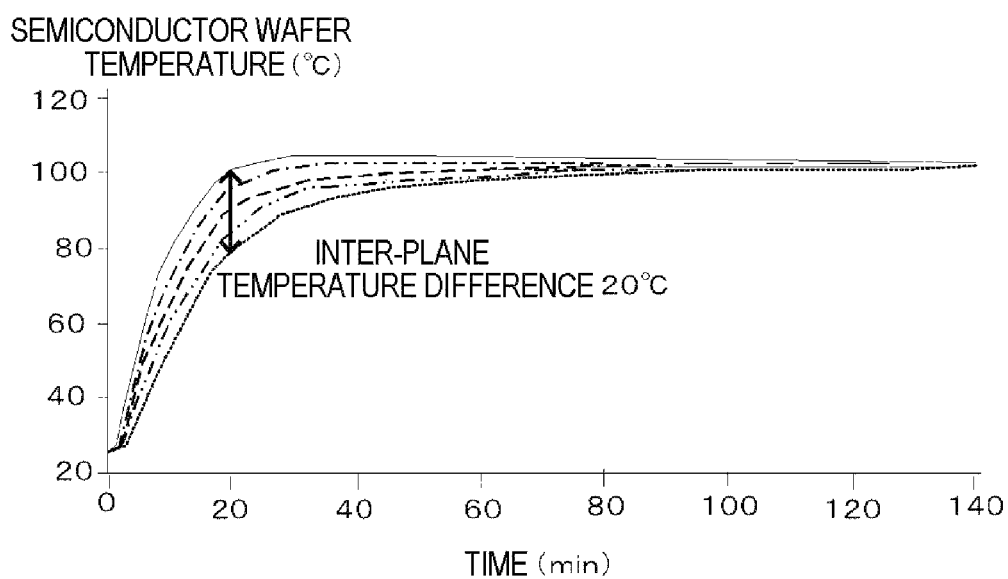

HEAT TREATMENT APPARATUS, HEAT TREATMENT METHOD, AND PROGRAM

CROSS-REFERENCE TO RELATED APPLICATIONS

This application is based on and claims priority from Japanese Patent Application No. 2015-074088 filed on Mar. 31, 2015 with the Japan Patent Office, the disclosure of which is incorporated herein in its entirety by reference.

TECHNICAL FIELD

The present disclosure relates to a heat treatment apparatus, a heat treatment method, and a program for processing a workpiece such as, for example, a semiconductor wafer.

BACKGROUND

In a semiconductor device manufacturing process, a batch-type heat treatment apparatus has been used to collectively perform, for example, a film formation processing, an oxidation processing, and a diffusion processing on a plurality of workpieces such as, for example, semiconductor wafers. In the batch-type heat treatment apparatus, a film may be efficiently formed on the semiconductor wafers, but there is a problem in that it takes a long period of time until the temperature in the processing container is stabilized.

In order to solve the problem, for example, Japanese Patent Laid-Open Publication No. 2002-334844 has proposed a heat treatment method of outputting a temperature set value different from a target temperature at the time of carry-in of a wafer boat, and changing the temperature set value to a second temperature set value corresponding to the target temperature at the time of completion of the carry-in of a wafer boat, or before or after the completion.

SUMMARY

According to a first aspect, the present disclosure provides a heat treatment apparatus including: a heating unit configured to heat an inside of a processing chamber that accommodates a plurality of workpieces; a temperature drop rate model storing unit configured to store a temperature drop rate model that represents a temperature and a time of the inside of the processing chamber until the plurality of workpieces reach a predetermined temperature after the plurality of workpieces are accommodated in the processing chamber; and a heat treatment performing unit configured to set the temperature drop rate model stored in the temperature drop model storing unit and set the inside of the processing chamber to the temperature and the time represented in the temperature drop rate model. The temperature drop rate model unit stores a plurality of temperature drop rate models each having a different temperature drop rate. The processing chamber is divided into a plurality of zones, and the temperature drop rate model is set for each of the zones. The heat treatment performing unit sets, at least, a temperature drop rate model having a faster temperature drop rate in a zone where the workpieces accommodated in the processing chamber are easily heated, or a temperature drop rate model having a slower temperature drop rate in a zone where the workpieces accommodated in the processing chamber are hardly heated, to thereby heat the plurality of workpieces accommodated in the processing chamber.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 6 is a view illustrating a relationship between a temperature of a semiconductor wafer in each zone and a time after loading in the present exemplary embodiment.

FIG. 7 is a view illustrating a relationship between a temperature of a semiconductor wafer in each zone and a time after loading in the prior art.

DETAILED DESCRIPTION

Figure 1:
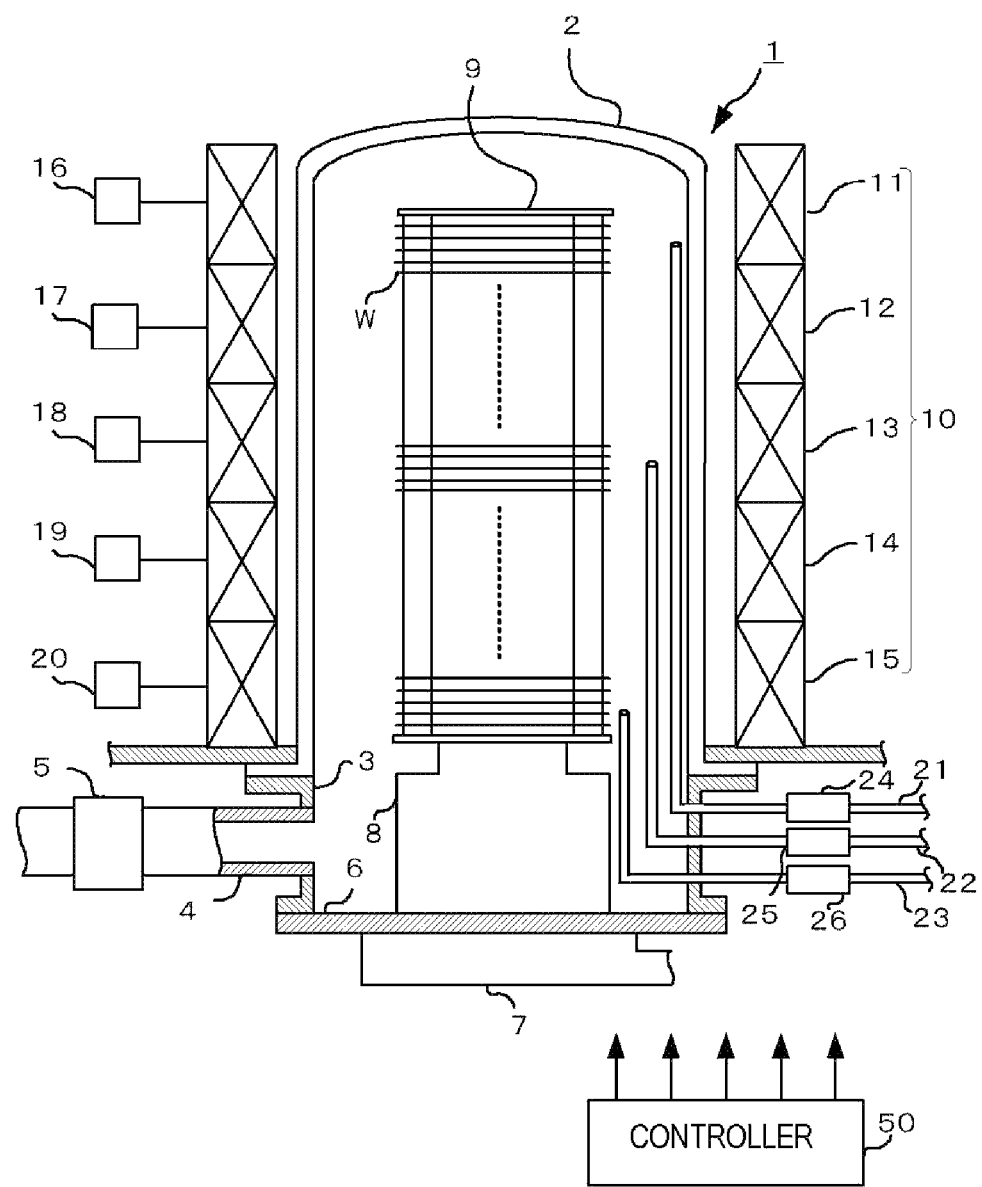
FIG. 1 is a view illustrating a structure of a heat treatment apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In a state where a plurality of semiconductor wafers are loaded into the processing container by carrying the wafer boat into the processing container, even though the inside of the processing container is heated to a predetermined temperature, a temperature difference may easily occur between the semiconductor wafers accommodated in the upper region and the lower region inside the processing container. Therefore, there is a demand for a heat treatment apparatus capable of reducing an inter-plane temperature difference of the semiconductor wafers accommodated in the processing container.

The present disclosure has been made in consideration of the above circumstance, and an object of the present disclosure is to provide a heat treatment apparatus, a heat treatment method, and a program, which can reduce the inter-plane temperature difference of the workpieces.

According to a first aspect, the present disclosure provides a heat treatment apparatus including: a heating unit configured to heat an inside of a processing chamber that accommodates a plurality of workpieces; a temperature drop rate model storing unit configured to store a temperature drop rate model that represents a temperature and a time of the inside of the processing chamber until the plurality of workpieces reach a predetermined temperature after the plurality of workpieces are accommodated in the processing chamber; and a heat treatment performing unit configured to set the temperature drop rate model stored in the temperature drop model storing unit and set the inside of the processing chamber to the temperature and the time represented in the temperature drop rate model. The temperature drop rate model unit stores a plurality of temperature drop rate models each having a different temperature drop rate. The processing chamber is divided into a plurality of zones, and the temperature drop rate mode is set for each of the zones. The heat treatment performing unit sets, at least, a temperature drop rate model having a faster temperature drop rate in a zone where the workpieces accommodated in the processing chamber are easily heated, or a temperature drop rate model having a slower temperature drop rate in a zone where the workpieces accommodated in the processing chamber are hardly heated, to thereby heat the plurality of workpieces accommodated in the processing chamber.

The heat treatment performing unit sets a temperature drop rate model having the fastest temperature drop rate in an upper zone in the processing chamber, and sets a temperature drop rate model to have a slower temperature drop rate toward a lower zone side in the processing chamber.

The heat treatment performing unit sets a different temperature drop rate model for each of the zones in the processing chamber.

According to a second aspect, the present disclosure provides a heat treatment method including: a heating step of heating an inside of a processing chamber that accommodates a plurality of workpieces; a temperature drop rate model storing step of storing a temperature drop rate model that represents a temperature and a time of the inside of the processing chamber until the plurality of workpieces reach a predetermined temperature after the plurality of workpieces are accommodated in the processing chamber; and a heat treatment performing step of setting the temperature drop rate model stored in the temperature drop model storing unit and set the inside of the processing chamber to the temperature and the time represented in the temperature drop rate model. In the temperature drop rate model storing step, a plurality of temperature drop rate models, each having a different temperature drop rate, are stored. The processing chamber is divided into a plurality of zones, and the temperature drop rate mode is set for each of the zones. In the heat treatment performing step, at least, a temperature drop rate model having a faster temperature drop rate is set in a zone where the workpieces accommodated in the processing chamber are easily heated, or a temperature drop rate model having a slower temperature drop rate is set in a zone where the workpieces accommodated in the processing chamber are hardly heated, to thereby heat the plurality of workpieces accommodated in the processing chamber.

According to a third aspect, the present disclosure provides a non-transitory computer-readable storage medium that stores a program which, when executed, causes a computer to function as: a heating unit configured to heat an inside of a processing chamber that accommodates a plurality of workpieces; a temperature drop rate model storing unit configured to store a temperature drop rate model that represents a temperature and a time of the inside of the processing chamber until the plurality of workpieces reach a predetermined temperature after the plurality of workpieces are accommodated in the processing chamber; and a heat treatment performing unit configured to set the temperature drop rate model stored in the temperature drop model storing unit and set the inside of the processing chamber to the temperature and the time represented in the temperature drop rate model. The temperature drop rate model unit stores a plurality of temperature drop rate models each having a different temperature drop rate. The processing chamber is divided into a plurality of zones, and the temperature drop rate mode is set for each of the zones. The heat treatment performing unit sets, at least, a temperature drop rate model having a faster temperature drop rate in a zone where the workpieces accommodated in the processing chamber are easily heated, or a temperature drop rate model having a slower temperature drop rate in a zone where the workpieces accommodated in the processing chamber are hardly heated, to thereby heat the plurality of workpieces accommodated in the processing chamber.

According to the present disclosure, the inter-plane temperature difference of the workpieces may be reduced.

Hereinafter, the present exemplary embodiment will be described with respect to a case where the heat treatment apparatus, the heat treatment method, and the program of the present invention are applied to a batch type vertical heat treatment apparatus illustrated in FIG. 1.

As illustrated in FIG. 1, a heat treatment apparatus 1 includes a substantially cylindrical reaction tube 2 having a ceiling. The reaction tube 2 is arranged such that its longitudinal direction is directed in the vertical direction. The reaction tube 2 is formed of a material that is excellent in heat resistance and corrosion resistance, for example, quartz.

A substantially cylindrical manifold 3 is provided at a lower side of the reaction tube 2. The upper end of the manifold 3 is hermetically joined to the lower end of the reaction tube 2. The manifold 3 is hermetically connected to an exhaust pipe 4 to exhaust gas inside the reaction tube 2. The exhaust pipe 4 is provided with a pressure adjusting unit 5 such as, for example, a valve or a vacuum pump, and adjusts the inside of the reaction tube 2 to a desired pressure (degree of vacuum).

A cover 6 is provided at a lower side of the manifold 3 (reaction tube 2). The cover 6 is configured to be movable up and down by a boat elevator 7. Thus, the cover 6 is disposed such that, when the cover 6 is moved up by the boat elevator 7, the lower side (furnace opening portion) of the manifold 3 (reaction tube 2) is closed, and when the cover 6 is moved down by the boat elevator 7, the lower side (furnace opening portion) of the manifold 3 (reaction tube 2) is opened.

A wafer boat 9 is provided above the cover 6 through a heat insulating cylinder (heat insulator) 8. The wafer boat 9 is a wafer holder that accommodates (holds) workpieces, for example, semiconductor wafers W. In the present exemplary embodiment, the wafer boat 9 is configured to accommodate a plurality (e.g., 150 sheets) of semiconductor wafers W at predetermined intervals in the vertical direction. Then, the semiconductor wafers W are accommodated in the wafer boat 9, and the cover 6 is moved up by the boat elevator 7, so that the semiconductor wafers W are loaded into the reaction tube 2.

Figure 2:
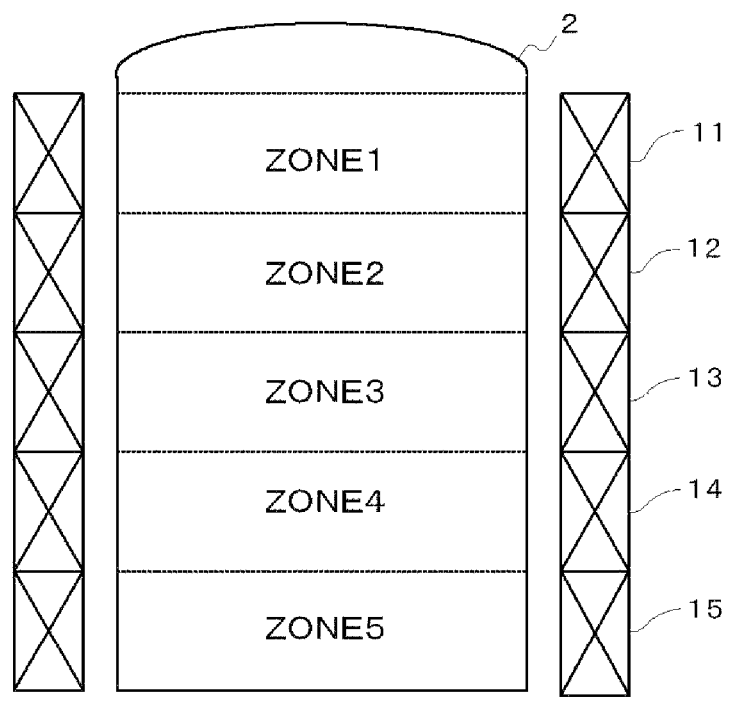
FIG. 2 is a view illustrating zones in a reaction tube.

A heater unit 10 including, for example, resistance heating elements is provided around the reaction tube 2 to surround the reaction tube 2. The inside of the reaction tube 2 is heated to a predetermined temperature by the heater unit 10. As a result, the semiconductor wafers W are heated to a predetermined temperature. The heater unit 10 is constituted with, for example, heaters 11 to 15 arranged in five tiers. The heaters 11 to 15 are connected to heater controllers 16 to 20, respectively. Therefore, since power is independently supplied to the respective heater controllers 16 to 20, the respective heaters 11 to 15 may be independently heated to a desired temperature. As described above, the inside of the reaction tube 2 is divided into five zones by the heaters 11 to 15, as illustrated in FIG. 2. For example, when the top (TOP) (ZONE 1) in the reaction tube 2 is heated, the heater controller 16 is controlled to heat the heater 11 to a desired temperature. When the center (CTR) (ZONE 3) in the reaction tube 2 is heated, the heater controller 18 is controlled to heat the heater 13 to a desired temperature. When the bottom (BTM) (ZONE 5) in the reaction tube 2 is heated, the heater controller 20 is controlled to heat the heater 15 to a desired temperature.

Further, the manifold 3 is provided with a plurality of processing gas supply pipes to supply a processing gas into the reaction tube 2. FIG. 1 illustrates three processing gas supply pipes 21 to 23 to supply the processing gas to the manifold 3. The processing gas supply pipe 21 is formed to extend from the side of the manifold 3 to the vicinity of the top of the wafer boat 9 (ZONE 1). The processing gas supply pipe 22 is formed to extend from the side of the manifold 3 to the vicinity of the center of the wafer boat 9 (ZONE 3). The processing gas supply pipe 23 is formed to extend from the side of the manifold 3 to the vicinity of the bottom of the wafer boat 9 (ZONE 5).

The processing gas supply pipes 21 to 23 are provided with flow rate adjusting units 24 to 26, respectively. Each of the flow rate adjusting units 24 to 26 is constituted with a mass flow controller (MFC) to adjust the flow rate of the processing gas flowing through the processing gas supply pipes 21 to 23. Thus, the processing gas supplied from each of the processing gas supply pipes 21 to 23 is adjusted at a desired flow rate by each of the flow rate adjusting units 24 to 26, and then, supplied into the reaction tube 2.

Figure 3:
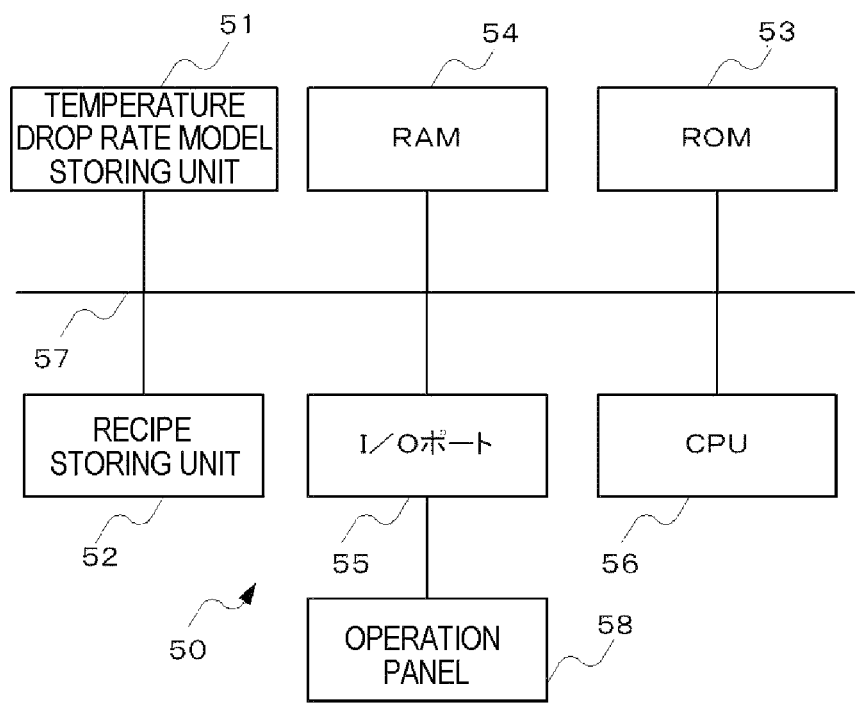
FIG. 3 is a view illustrating an exemplary configuration of the controller in FIG. 1.

Further, the heat treatment apparatus 1 includes a controller 50 configured to control processing parameters such as, for example, a gas flow rate, pressure, and temperature of the processing atmosphere in the reaction tube 2. The controller 50 outputs a control signal to the flow rate controlling units 24 to 26, the pressure adjusting unit 5, or the heater controllers 16 to 20 of the heaters 11 to 15. FIG. 3 illustrates the configuration of the controller 50.

As illustrated in FIG. 3, the controller 50 includes a temperature drop rate model storing unit 51, a recipe storing unit 52, a read only memory (ROM) 53, a random access memory (RAM) 54, an input/output (I/O) port 55, a central processing unit 56, and a bus 57 that connects these components with each other.

Figure 4:
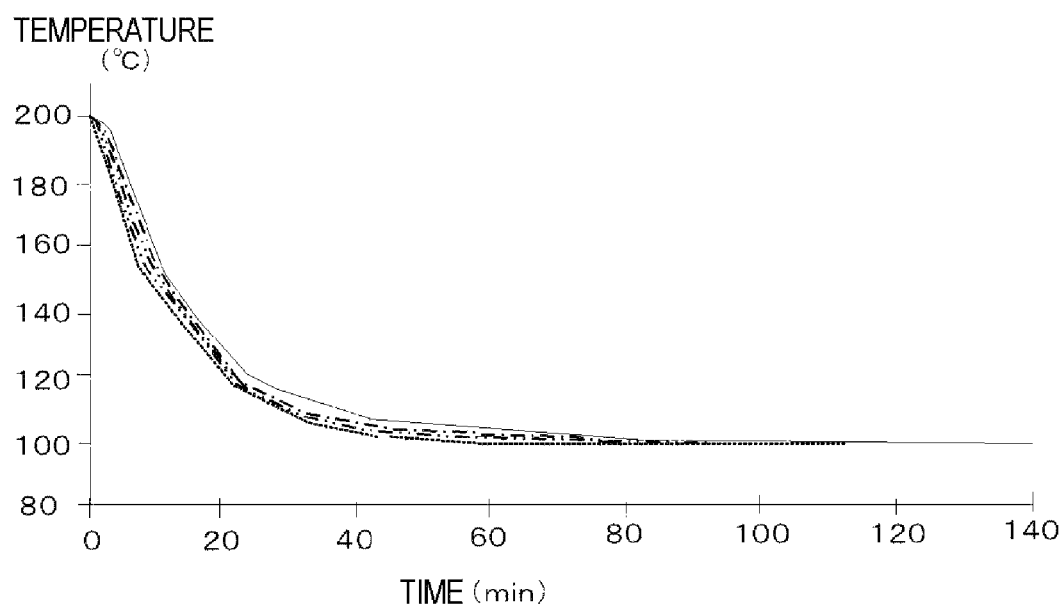
FIG. 4 is a view illustrating an exemplary temperature drop rate model.

The temperature drop rate model storing unit 51 stores a plurality of temperature drop rate models, each of which has a different temperature drop rate. The temperature drop model is a model that represents a temperature and a time in the reaction tube 2 until the semiconductor wafers W reach a predetermined temperature after the semiconductor wafers W are loaded into the reaction tube 2. FIG. 4 illustrates an exemplary temperature drop rate model. As illustrated in FIG. 4, for example, in a case where the semiconductor wafers W accommodated in the reaction tube 2 are heated to 100° C., the temperature drop rate model exhibits a temperature drop rate at which the temperature in the reaction tube 2 is decreased gradually to 100° C. after the standby temperature is increased to 200° C.

In general, when a plurality of semiconductor wafers W are loaded into the reaction tube 2 by carrying the wafer boat 9 into the reaction tube 2, and the semiconductor wafers W are heated to a predetermined temperature, a temperature difference may easily occur between the temperature of the semiconductor wafers W accommodated in the top region (TOP) and the temperature of the semiconductor wafers W accommodated in the bottom region (BTM). In the present disclosure, in order to reduce the inter-plane temperature difference of the semiconductor wafers W, temperature drop rate models having a different temperature drop rate are assigned depending on zones, and the semiconductor wafers W are heated to a predetermined temperature. For example, a temperature drop rate model having a fast temperature rate is assigned to TOP (ZONE 1) in the reaction tube 2, and temperature drop rate models having a slower temperature rate are assigned toward BTM (ZONE 5) in the reaction tube 2. Accordingly, the temperatures of the semiconductor wafers W accommodated in the reaction tube 2 become uniform, so that the inter-plane temperature difference of the semiconductor wafers W accommodated in the reaction tube 2 is reduced.

The recipe storing unit 52 stores a process recipe that determines a control procedure depending on the kind of the film formation processing performed in the heat treatment apparatus 1. The process recipe is a recipe prepared for every processing (process) actually performed by a user, and defines the temperature, the time, and the gas flow rate, from the loading of the semiconductor wafers W into the reaction tube 2 to the unloading of the processed semiconductor wafers W therefrom. Specifically, the process recipe defines the temperature change of each unit, the pressure change within the reaction tube 2, the timings of the start of the supply of the gas and the stop of the supply, and the supply amount.

The ROM 53 is a storage medium that is constituted by an electrically erasable programmable read-only memory (EEPROM), a flash memory, or a hard disc, and stores an operation program of the CPU 56. The RAM 54 functions as a work area of the CPU 56.

The I/O port 55 supplies a measurement signal for the temperature, the pressure, or the gas flow rate, and outputs a control signal output by the CPU 56 to the respective units (e.g., the pressure adjusting unit 5, the heater controllers 16 to 20 of the heaters 11 to 15 and the flow rate controlling units 24 to 26). Further, the I/O port 55 is connected with an operation panel 58 with which an operator operates the heat treatment apparatus 1.

The CPU 56 constitutes the core of the controller 50. The CPU 56 executes the operation program stored in the ROM 53, and according to the instructions from the operation panel 58, controls the operations of the heat treatment apparatus 1 along the process recipe stored in the recipe storing unit 52.

The bus 57 transmits information between the respective units.

Figure 5:
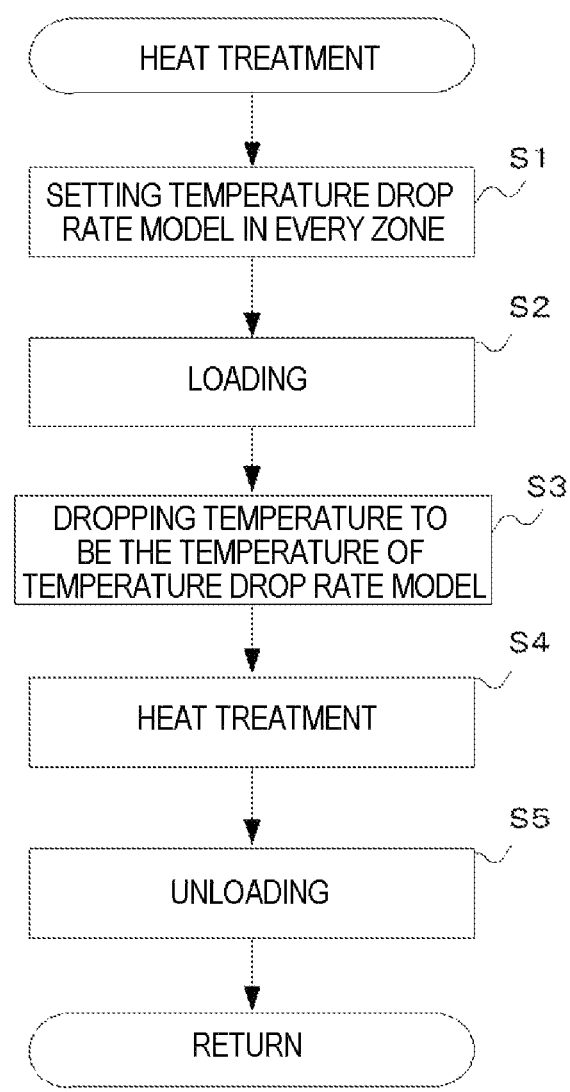
FIG. 5 is a flowchart for explaining a heat treatment.

Next, descriptions will be made on a heat treatment method (heat treatment) using the heat treatment apparatus 1 configured as described above. Hereinafter, the present exemplary embodiment will be described with respect to an example in which a plurality of semiconductor wafers W are loaded into the reaction tube 2 that has been heated to 200° C., and the semiconductor wafers W are heated to 100° C. FIG. 5 is a flowchart for explaining the heat treatment. In the following descriptions, the operations of the respective units are controlled by the controller 50 (CPU 56).

First, among the plurality of temperature drop rate models, each having a different temperature drop rate, stored in the temperature drop rate model storing unit 51, the CPU 56 sets a temperature drop rate model for every zone (step S1). For example, the CPU 56 sets temperature drop rate models each having a different temperature drop rate in ZONE 1 to ZONE 5, such that a temperature drop rate model having the fastest temperature drop rate (the temperature drop rate model having the steepest temperature drop gradient in FIG. 4) is set in TOP (ZONE 1) within the reaction tube 2, and temperature drop rate models having a slower temperature drop rate (the temperature drop rate models having a more gentle temperature drop gradient in FIG. 4) are set toward BTM (ZONE 5) side within the reaction tube 2.

Next, the CPU 56 controls the heater controllers 16 to 20 of the heaters 11 to 15 such that the temperature of each of the set temperature drop rate models becomes, for example, 200° C. as illustrated in FIG. 4. Further, the CPU 56 causes the boat elevator 7 (cover 6) to be moved down so that the wafer boat 9 equipped with a semiconductor wafer W is disposed on the cover 6. Subsequently, the CPU 56 causes the boat elevator 7 (cover 6) to be moved up so that the wafer boat 9 (the semiconductor wafers W) is loaded into the reaction tube 2 (step S2).

When the semiconductor wafers W are loaded into the reaction tube 2, the CPU 56 controls the heater controllers 16 to 20 to drop the temperatures of the heaters 11 to 15 to the temperatures of the set temperature drop rate models, respectively, so that the semiconductor wafers W are heated to, for example, 100° C. as illustrated in FIG. 4 (step S3). Then, when the semiconductor wafers W are heated to 100° C., the CPU 56 causes a predetermined heat treatment (step S4) to be performed, then causes the boat elevator 7 (cover 6) to be moved down so that the wafer boat 9 (the semiconductor wafers W) is unloaded to the outside of the reaction tube 2 (step 5), and then, terminates the treatment.

Subsequently, in order to confirm the effect of the present disclosure, the relationship between the temperature of the semiconductor wafers in each zone and the time after loading was measured with respect to the case where the semiconductor wafers W were heated by the heat treatment of the exemplary embodiment. The result is represented in FIG. 6. For comparison, FIG. 7 illustrates a result of the relationship between the temperature of the semiconductor wafers W in each zone and the time after loading in a case where the semiconductor wafers W are heated by a heat treatment using only one temperature drop rate model.

As illustrated in FIGS. 6 and 7, it was confirmed that when a temperature drop rate model having the fastest temperature drop rate is set in TOP within the reaction tube 2, and temperature drop rate models are set to have a slower temperature drop rate toward BTM side within the reaction tube 2, the temperature of the semiconductor wafers W accommodated in the reaction tube 2 becomes uniform to reduce the inter-plane temperature difference of the semiconductor wafers W to 10° C. that is half that represented in FIG. 7.

As described above, since the inter-plane temperature difference of the semiconductor wafers W is reduced, the heat (thermal history) applied to the semiconductor wafers W may be uniformalized. When the thermal history applied to the semiconductor wafers W is uniformalized, variation in heat treatment may be reduced, thereby enhancing the reproducibility of the heat treatment. Further, in the heat treatment apparatus 1, the heat treatment is performed after wait until the temperature of the semiconductor wafers W is stabilized. Therefore, the temperature of the semiconductor wafers W is rapidly stabilized, so that the time for the heat treatment may be shortened. Thus, the productivity of the heat treatment may be enhanced.

Further, for example, in a case where a substrate with impurities injected thereto is processed, the impurities are diffused when heat is applied thereto, in some cases. Thus, the thermal history of a non-processed substrate performed in the prior step may be problematic depending on the processing. In the exemplary embodiment, since the thermal history applied to the semiconductor wafers W has been uniformalized, the reproducibility of the heat treatment may be enhanced without adjusting the thermal history.

As described above, according to the exemplary embodiment, since a temperature drop rate model having the fastest temperature drop rate is set in TOP within the reaction tube 2, and temperature drop rate models are set to have a slower temperature drop rate toward BTM side within the reaction tube 2, the temperature of the semiconductor wafers W accommodated in the reaction tube 2 becomes uniform to reduce the inter-plane temperature difference of the semiconductor wafers W.

Further, the present disclosure is not limited to the above-described exemplary embodiment, and various modifications and applications may be made thereto. Hereinafter, descriptions will be made on other exemplary embodiments that are applicable to the present disclosure.

In the exemplary embodiment, the present disclosure was exemplified by the case where temperature drop rate models, each having a different temperature drop rate, are set in all zones. However, a temperature drop rate model having a faster temperature drop rate may be set in a zone where the semiconductor wafers W accommodated in the reaction tube 2 are easily heated, or a temperature drop rate model having a slower temperature drop rate may be set in a zone where the semiconductor wafers W accommodated in the reaction tube 2 are hardly heated. The temperature drop rate model may be set in various manners. For example, temperature drop rate models having the same temperature drop rate may be set in different zones such that, while the temperature drop rate model having the fastest temperature drop rate is set in TOP within the reaction tube 2, and the temperature drop rate model having the slowest temperature drop rate is set in BTM within the reaction tube 2, temperature drop rate models having a medium temperature rate of both temperature rates are set in three zones therebetween. In this case, the inter-temperature difference of the semiconductor wafers W may be reduced.

In the above-described exemplary embodiment, the present disclosure was described with respect to the case where the number of tiers of the heaters (the number of zones) is five. However, the number of tiers may be four or less, or six or more. Further, the number of semiconductor wafers W extracted from each zone may be arbitrarily set.

In the above-described exemplary embodiment, the present disclosure was described with respect to the case of the batch-type heat treatment apparatus having a single tube structure. However, the present disclosure may also be applied to a batch-type vertical heat treatment apparatus having a double tube structure in which the reaction tube 2 is constituted by an inner tube and an outer tube. The present disclosure is not limited to the processing of the semiconductor wafers W, but is also applicable to a processing of, for example, flat panel display (FPD) substrates, glass substrates, or plasma display panel (PDP) substrates.

The controller 50 according to the exemplary embodiment of the present disclosure may be realized using a general computer system without any dedicated system. For example, the controller 50, which executes the processing described above, may be constituted by installing a program for executing the processing described above from a storage medium (e.g., a flexible disc or a compact disc read only memory (CD-ROM)) storing the program to a general purpose computer.

And, the means to supply the program is arbitrary. The program may be supplied via, for example, a communication line, a communication network, or a communication system, besides the predetermined storage medium as described above. In this case, the program is uploaded on, for example, a bulletin board system (BBS) of a communication network, and provided in superposition on a carrier wave via a network. Then, the thus-provided program is started and executed similarly to other application programs under a control of an operating system (OS), so that the above-described processing is performed.

The present disclosure is useful for a heat treatment apparatus, a heat treatment method, and a program for heat-treating a workpiece such as, for example, a semiconductor wafer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A heat treatment apparatus comprising:
a heating unit configured to heat an inside of a processing chamber that accommodates a plurality of workpieces;
a temperature drop rate model storing unit configured to store a temperature drop rate model that represents a temperature and a time of the inside of the processing chamber until the plurality of workpieces reach a predetermined temperature after the plurality of workpieces are accommodated in the processing chamber; and
a heat treatment performing unit configured to set the temperature drop rate model stored in the temperature drop model storing unit and set the inside of the processing chamber to the temperature and the time represented in the temperature drop rate model,
wherein the temperature drop rate model storing unit stores a plurality of temperature drop rate models each having a different temperature drop rate,
the processing chamber is divided into a plurality of zones, and the temperature drop rate mode is set for each of the zones, and
the heat treatment performing unit sets, at least, a temperature drop rate model having a faster temperature drop rate in a zone where the workpieces accommodated in the processing chamber are easily heated, or a temperature drop rate model having a slower temperature drop rate in a zone where the workpieces accommodated in the processing chamber are hardly heated, to thereby heat the plurality of workpieces accommodated in the processing chamber.

2. The heat treatment apparatus of claim 1, wherein the heat treatment performing unit sets a temperature drop rate model having the fastest temperature drop rate in an upper zone in the processing chamber, and sets a temperature drop rate model to have a slower temperature drop rate toward a lower zone side in the processing chamber.

3. The heat treatment apparatus of claim 1, wherein the heat treatment performing unit sets a different temperature drop rate model for each of the zones in the processing chamber.

4. A heat treatment method comprising:
a heating step of heating an inside of a processing chamber that accommodates a plurality of workpieces are accommodated;
a temperature drop rate model storing step of storing a temperature drop rate model that represents a temperature and a time of the inside of the processing chamber until the plurality of workpieces reach a predetermined temperature after the plurality of workpieces are accommodated in the processing chamber; and
a heat treatment performing step of setting the temperature drop rate model stored in the temperature drop model storing unit, and setting the inside of the processing chamber to the temperature and the time represented in the temperature drop rate model,
wherein in the temperature drop rate model storing step, a plurality of temperature drop rate models, each having a different temperature drop rate, are stored,
the processing chamber is divided into a plurality of zones, and the temperature drop rate mode is set for each of the zones, and
in the heat treatment performing step, at least, a temperature drop rate model having a faster temperature drop rate is set in a zone where the workpieces accommodated in the processing chamber are easily heated, or a temperature drop rate model having a slower temperature drop rate is set in a zone where the workpieces accommodated in the processing chamber are hardly heated, to thereby heat the plurality of workpieces accommodated in the processing chamber.

5. A non-transitory computer-readable storage medium that stores a program which, when executed, causes a computer to function as:
a heating unit configured to heat an inside of a processing chamber that accommodates a plurality of workpieces;
a temperature drop rate model storing unit configured to store a temperature drop rate model that represents a temperature and a time of the inside of the processing chamber until the plurality of workpieces reach a predetermined temperature after the plurality of workpieces are accommodated in the processing chamber; and
a heat treatment performing unit configured to set the temperature drop rate model stored in the temperature drop model storing unit such that the inside of the processing chamber is set at the temperature and the time represented in the temperature drop rate model,
wherein the temperature drop rate model unit stores a plurality of temperature drop rate models each having a different temperature drop rate,
the processing chamber is divided into a plurality of zones, and the temperature drop rate mode is set for each of the zones, and
the heat treatment performing unit sets, at least, a temperature drop rate model having a faster temperature drop rate in a zone where the workpieces accommodated in the processing chamber are easily heated, or a temperature drop rate model having a slower temperature drop rate in a zone where the workpieces accommodated in the processing chamber are hardly heated, to thereby heat the plurality of workpieces accommodated in the processing chamber.

* * * * *